(12) United States Patent
Lin et al.

(10) Patent No.: US 12,713,690 B2
(45) Date of Patent: Aug. 18, 2026

(54) SEMICONDUCTOR DEVICE

(71) Applicant: MEDIATEK INC., Hsinchu City (TW)

(72) Inventors: Cheng-Hua Lin, Hsinchu City (TW); Yan-Liang Ji, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 492 days.

(21) Appl. No.: 18/359,123

(22) Filed: Jul. 26, 2023

(65) Prior Publication Data

US 2024/0072044 A1 Feb. 29, 2024

Related U.S. Application Data

(60) Provisional application No. 63/373,559, filed on Aug. 26, 2022.

(51) Int. Cl.

| | |
|---|---|
| ***H10D 84/40*** | (2025.01) |
| ***H10D 62/13*** | (2025.01) |
| ***H10D 62/17*** | (2025.01) |
| ***H10D 84/83*** | (2025.01) |

(52) U.S. Cl.
CPC ......... *H10D 84/401* (2025.01); *H10D 62/151* (2025.01); *H10D 62/393* (2025.01); *H10D 84/83* (2025.01)

(58) Field of Classification Search
CPC .. H10D 84/401; H10D 62/151; H10D 62/393; H10D 84/83; H10D 30/603; H10D 62/127
USPC .......................................................... 257/401
See application file for complete search history.

(56) References Cited

U.S. PATENT DOCUMENTS

2014/0225192 A1* 8/2014 Lee ........................ H10D 30/65
438/286

* cited by examiner

*Primary Examiner* — Theresa T Doan
(74) *Attorney, Agent, or Firm* — McClure, Qualey & Rodack, LLP

(57) ABSTRACT

A semiconductor device is provided. The semiconductor device includes a substrate, a gate strip, a source doped region and a body doped region. The substrate has an active region. The gate strip is disposed on the substrate within the active region. The gate strip extends along a first direction. The source doped region is located in the active region and adjacent to a first side of the gate strip along the first direction. The body doped region is located in the active region and adjacent to the first side of the gate strip. The body doped region and the source doped region have opposite conductivity types. The body doped region has a first length along a second direction that is different from the first direction, wherein the first length gradually changes along the first direction.

32 Claims, 7 Drawing Sheets

SEMICONDUCTOR DEVICE

CROSS REFERENCE TO RELATED APPLICATIONS

This application claims the benefit of U.S. Provisional Application No. 63/373,559, filed Aug. 26, 2022, the entirety of which is incorporated by reference herein.

BACKGROUND OF THE INVENTION

Field of the Invention

The present invention relates to a semiconductor device, and, in particular, to a power metal-oxide-semiconductor field effect transistor (MOSFET) device.

Description of the Related Art

Battery-operated electronic systems such as notebook personal computers, personal digital assistants, and wireless communication devices often use power metal-oxide-semiconductor (MOS) devices as low on-resistance (Ron) electronic switches for distributing battery power. For battery-operated applications, low on-resistance can be particularly important to ensure as little power consumption on the battery as possible. This ensures a long battery life. However, the problems of increased on-resistance become significant in high-density power MOS devices.

Thus, a novel power MOS electronic device is needed.

BRIEF SUMMARY OF THE INVENTION

An embodiment of the present invention provides a semiconductor device. The semiconductor device includes a substrate, a gate strip, a source doped region and a body doped region. The substrate has an active region. The gate strip is disposed on the substrate within the active region. The gate strip extends along a first direction. The source doped region is located in the active region and adjacent to a first side of the gate strip along the first direction. The body doped region is located in the active region and adjacent to the first side of the gate strip. The body doped region and the source doped region have opposite conductivity types. The body doped region has a first length along a second direction that is different from the first direction. The first length gradually changes along the first direction.

An embodiment of the present invention provides a semiconductor device. The semiconductor device includes a substrate, a gate strip, a source doped region and a body doped region. The substrate of a first conductivity type has an active region. The gate strip is disposed on the substrate within the active region. The gate strip extends along a first direction. The source doped region of a second conductivity type is located in the active region and adjacent to a first side of the gate strip. The body doped region of the first conductivity type is located in the active region and adjacent to the first side of the gate strip. The body doped region has least one edge close to the first side of the first gate strip. An extended line of the edge of the body doped region meets the first side of the first gate strip. An angle between the extended line and the first side of the first gate strip is an acute angle.

In addition, an embodiment of the present invention provides a semiconductor device. The semiconductor device includes a substrate, a gate strip, a source doped region and a body doped region. The substrate of a first conductivity type has an active region. The gate strip is disposed on the substrate within the active region. The gate strip extends along a first direction. The source doped region of a second conductivity type is disposed in the active region and adjacent to a first side of the gate strip. The body doped region of the first conductivity type is disposed in the active region and adjacent to the first side of the gate strip. Ratios of widths of the body doped region to widths of the source doped region in cross-sectional views along lines in the first direction are gradually increased along a direction away from the first gate strip.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
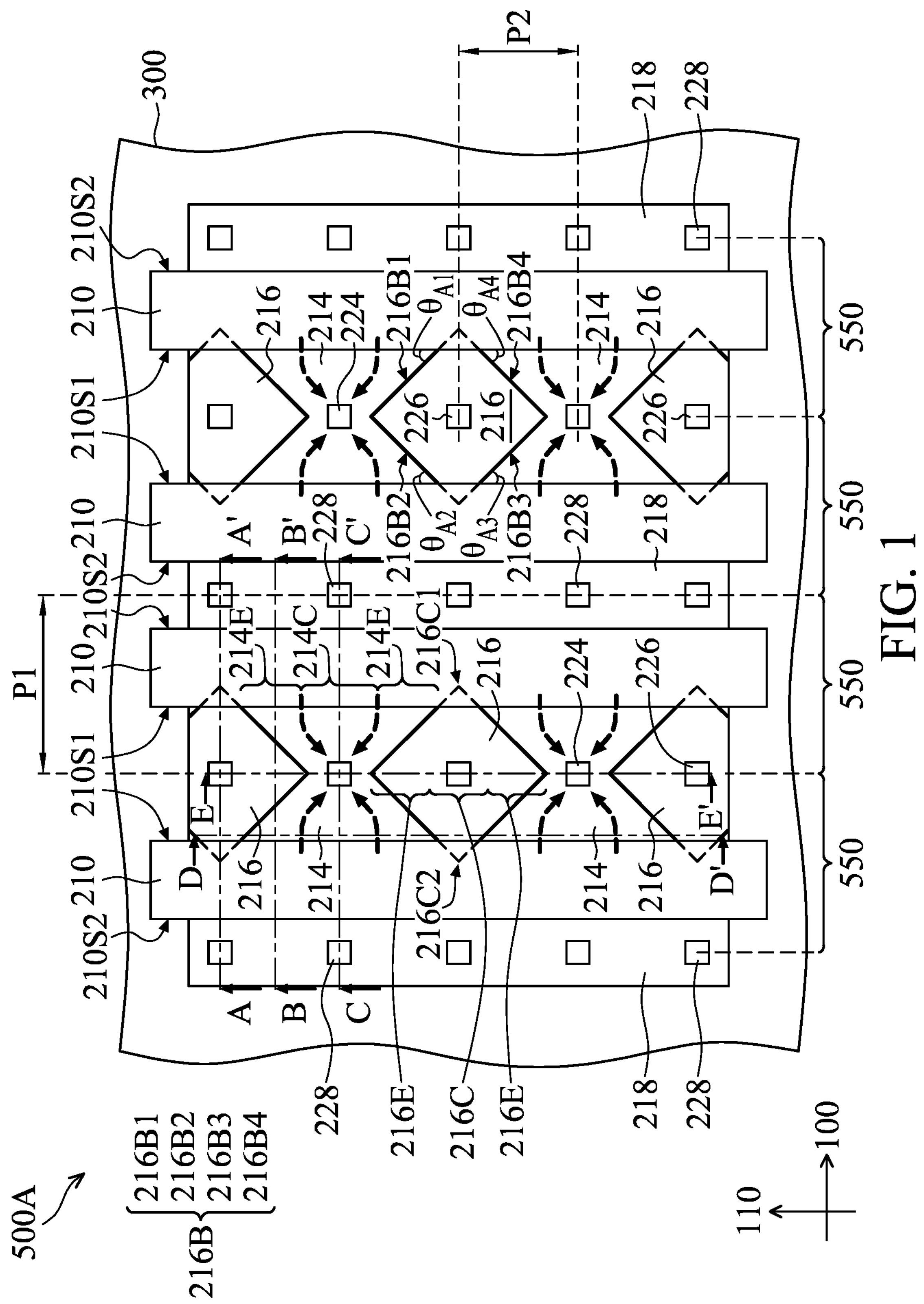
FIG. 1 is a schematic layout of a semiconductor device in accordance with some embodiments of the disclosure.
Figure 2A:
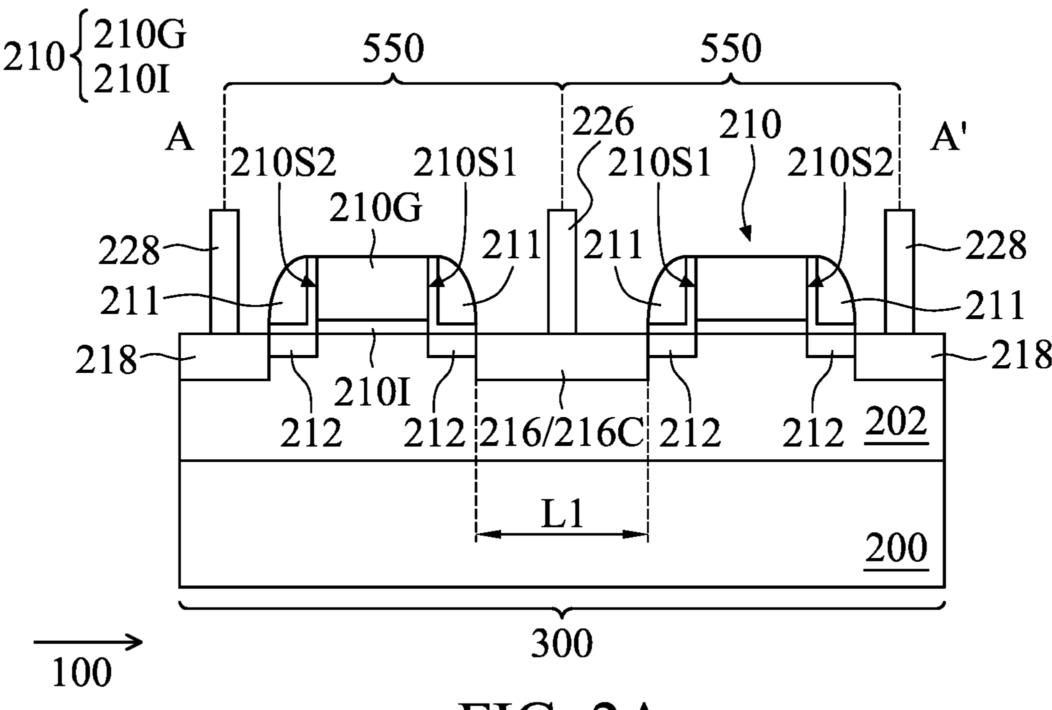
FIG. 2A is a cross-sectional view of the semiconductor device along the A-A' line of FIG. 1 in accordance with some embodiments of the disclosure.
Figure 2B:
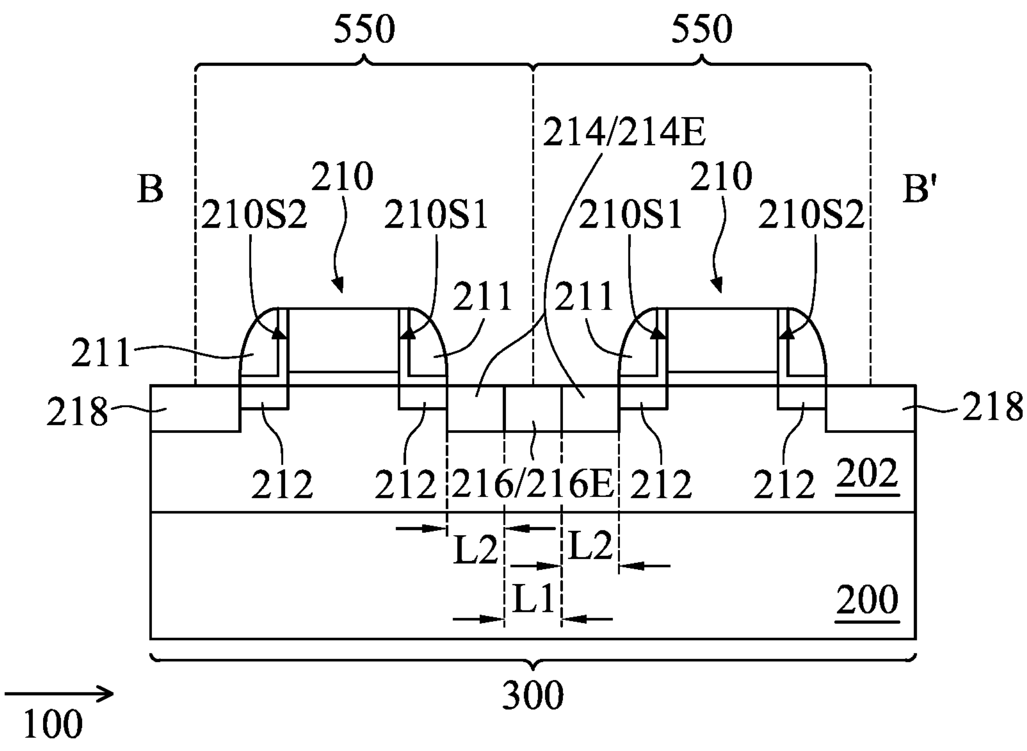
FIG. 2B is a cross-sectional view of the semiconductor device along the B-B' line of FIG. 1 in accordance with some embodiments of the disclosure.
Figure 2C:
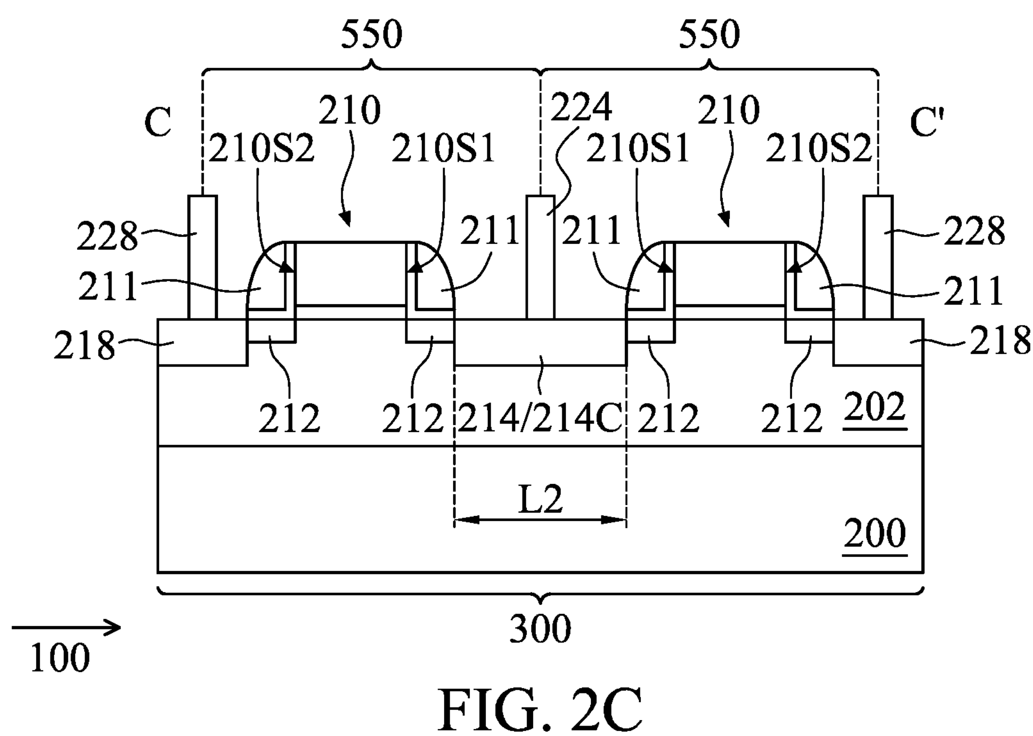
FIG. 2C is a cross-sectional view of the semiconductor device along the C-C' line of FIG. 1 in accordance with some embodiments of the disclosure.
Figure 2D:
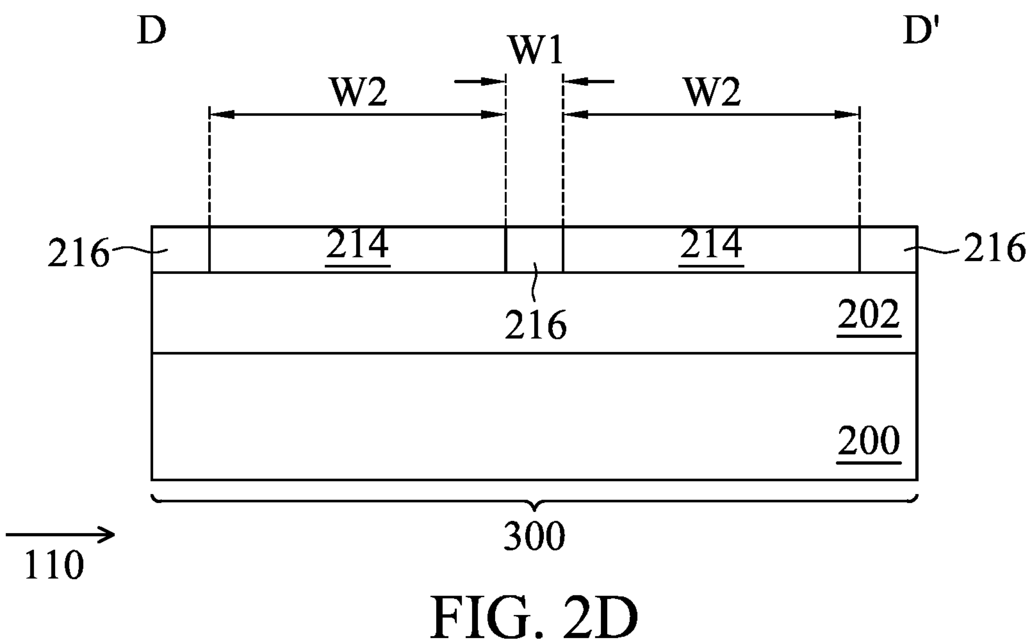
FIG. 2D is a cross-sectional view of the semiconductor device along the D-D' line of FIG. 1 in accordance with some embodiments of the disclosure.
Figure 2E:
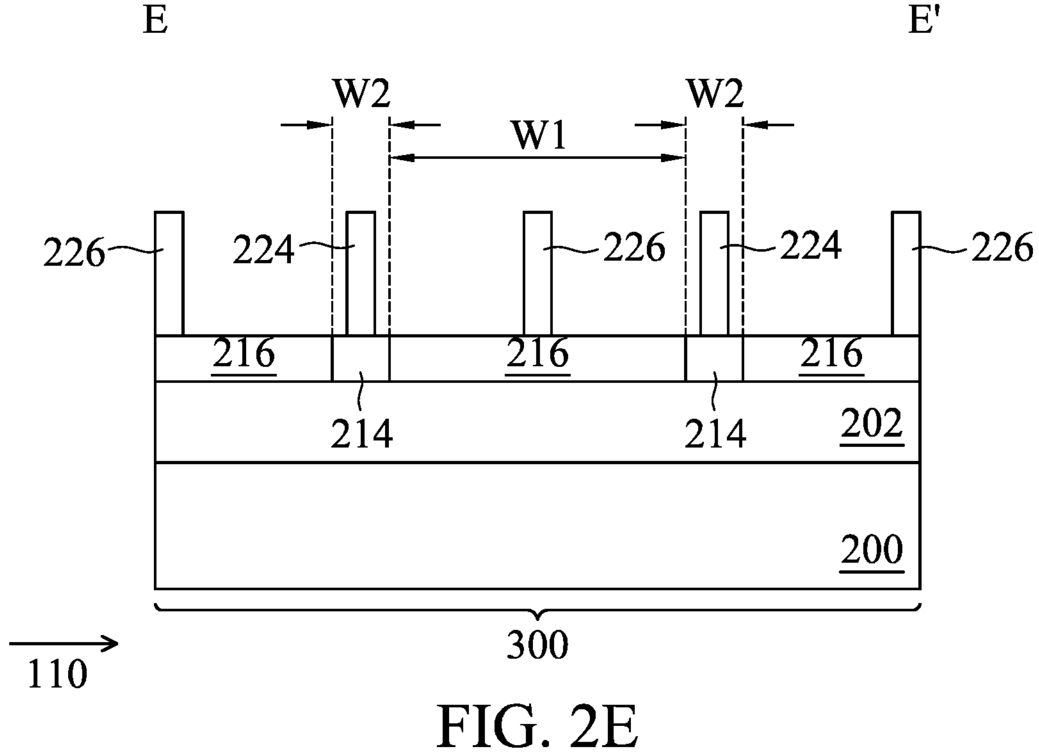
FIG. 2E is a cross-sectional view of the semiconductor device along the E-E' line of FIG. 1 in accordance with some embodiments of the disclosure.

FIGS. 1 and 3-5 are schematic layouts of semiconductor devices 500A, 500B, 500C and 500D in accordance with some embodiments of the disclosure. FIG. 2A is a cross-sectional view of the semiconductor device 500A along the A-A' line of FIG. 1 in accordance with some embodiments of the disclosure. FIG. 2B is a cross-sectional view of the semiconductor device 500A along the B-B' line of FIG. 1 in accordance with some embodiments of the disclosure. FIG. 2C is a cross-sectional view of the semiconductor device 500A along the C-C' line of FIG. 1 in accordance with some embodiments of the disclosure. FIG. 2D is a cross-sectional view of the semiconductor device 500A along the D-D' line of FIG. 1 in accordance with some embodiments of the disclosure. FIG. 2E is a cross-sectional view of the semiconductor device 500A along the E-E' line of FIG. 1 in accordance with some embodiments of the disclosure. FIGS. 1 and 3-5 only show some features for illustration, and the remaining features may be shown in the cross-sectional views of FIGS. 2A-2E. In FIG. 1 and the following figures, directions 100 and 110 may be referred to as a channel length direction and a channel width direction, respectively.

In some embodiments, the semiconductor device 500A includes a power metal-oxide-semiconductor field effect transistor (MOSFET) device. As shown in FIG. 1, the semiconductor device 500A including four unit cells 550 may arrange as an array in a direction 100 with a pitch P1. In some embodiments, any two of the adjacent unit cells 550 may be in mirror symmetry. In addition, any two of the adjacent unit cells 550 may have the common-source or common-drain arrangement. It should be noted that the number of the unit cells 550 of the semiconductor device 500A is merely an embodiment and not limited to the disclosed embodiment. In some embodiments, the unit cell 550 of the semiconductor device 500A includes a substrate 200, a gate strip 210, a source doped region 214, a body doped region 216 and a drain doped region 218.

As shown in FIG. 1, the substrate 200 has an active region 300 surrounded by an isolation feature (not shown). In some embodiments, the substrate 200 includes a semiconductor wafer or a silicon on insulator (SOI) wafer. The substrate 200 may be doped with dopants having a first conductivity type. When the first conductivity type is p-type, the substrate 200 is a p-type substrate. Alternatively, when the first conductivity type is n-type, the substrate 200 is an n-type substrate.

The unit cell 550 of the semiconductor device 500A further includes a well region 202 formed in the substrate 200 within the active region 300. In some embodiments, the well region 202 may be doped with dopants having the first conductivity type. When the semiconductor device 500A is an NMOS, the substrate 200 is, for example, a P-type substrate, the well region 202 is, for example, a P-type well region. In some embodiments, the doping concentration of the well region 202 is greater than the doping concentration of the substrate 200.

The gate strip 210 is disposed on the substrate 200 within the active region 300, In some embodiments, the gate strip 210 extends substantially along the direction 110. As shown in FIG. 1, the gate strip 210 may have a first side 210S1 and a second side 210S2 along the direction 110. In addition, the second side 210S2 is opposite to the first side 210S1. In some embodiments, the gate strip 210 includes a gate insulating layer 210I and a gate electrode layer 210G. The gate insulating layer 210I is formed on the substrate 200. The gate electrode layer 210G is formed on the gate insulating layer 210I. In addition, spacers 211 are formed on the first side 210S1 and the second side 210S2 of the gate strip 210. In some embodiments, a silicide feature (not shown) is formed on a top surface of the gate electrode layer 210G.

The source doped region 214 and the drain doped region 218 are located in the substrate 200 within the active region 300. The source doped region 214 and the drain doped region 218 are formed adjacent to the first side 210S1 and the second side 210S2 of the gate strip 210 along the direction 110, respectively. In some embodiments, the source doped region 214 and the drain doped region 218 may be doped with dopants having a second conductivity type opposite to the first conductivity type. For example, when the well region 202 is p-type, the source doped region 214 and the drain doped region 218 are n-type.

As shown in FIGS. 1, 2A-2C, the body doped region 216 is located in the substrate 200 within the active region 300. The body doped region 216 and the source doped region 214 are arranged side by side and adjacent to the first sides 210S1 of the gate strips 210 of the adjacent unit cells 550. In the unit cell 550, the body doped regions 216 is adjacent to the source doped region 214 along the direction 110. Furthermore, the body doped regions 216 and the source doped regions 214 are alternatively arranged along the direction 110. The body doped region 216 may be provided as a pick-up dope region for the well region 202. In some embodiments, both the body doped region 216 and the well region 202 have the same conductivity type (e.g., the first conductivity type). In addition, the body doped region 216 and the source doped region 214 have opposite conductivity types. For example, when the well region 202 is p-type and the source doped region 214 is n-type, the body doped region 216 is p-type. In some embodiments, the dopant concentration of the body doped region 216 is greater than that of the well region 202.

In some embodiments, the body doped region 216 between the gate strips 210 of the adjacent unit cells 550 may have a polygonal shape (e.g., a triangular shape, a diamond shape shown in FIG. 1, a pentagonal shape, a hexagonal shape shown in FIGS. 3 and 4, a heptagonal shape, an octagonal shape shown in FIG. 5 or another suitable polygonal shape) in a top view shown in FIGS. 1 and 3-5. In some other embodiments, the body doped region 216 between the gate strips 210 of the adjacent unit cells 550 may have polygonal shape with rounded corners.

As shown in FIG. 1, the body doped region 216 has edges 216B1, 216B2, 216B3 and 216B4, which may collectively serve as a boundary 216B between the body doped region 216 and the source doped region 214. However, the number of the edges of the body doped region 216 is not limited to the disclosure embodiments. The body doped region 216 may have least one edge close to the first side 210S1 (or the second side 210S2) of the adjacent gate strip 210. In addition, the edge of the body doped region 216 may meet the first side 210S1 (or the second side 210S2) of the adjacent gate strip 210. Alternatively, an extended line of the edge of the body doped region 216 may fully overlap the corresponding edge and meet the first side 210S1 (or the second side 210S2) of the adjacent gate strip 210. For example, in the semiconductor device 500A, the body doped region 216 may have two edges 216B1 and 216B4 meeting the first side 210S1 of the adjacent gate strip 210 of the right unit cell 550. In addition, the body doped region 216 may have two edges 216B2 and 216B3 meeting the first side 210S1 of the left gate strip 210 of left right unit cell 550. In some embodiments, an angle $\theta_{A1}$ between the edge 216B1 of the body doped region 216 and the first side 210S1 of the right gate strip 210 is an acute angle. An angle $\theta_{A2}$ between the edge 216B2 of the body doped region 216 and the second side 210S2 of the left gate strip 210 is an acute angle. An angle $\theta_{A3}$ between the edge 216B3 of the body doped region 216 and the second side 210S2 of the left gate strip 210 is an acute angle. An angle $\theta_{A4}$ between the edge 216B4 of the body doped region 216 and the first side 210S1 of the right gate strip 210 is an acute angle. That is to say, the edges 216B1, 216B2, 216B3 and 216B4 (or the extended lines of the edges 216B1, 216B2, 216B3 and 216B4) meeting the first side 210S1 or the second side 210S2 of the adjacent gate strip 210 may extend in directions that are not parallel to the directions 100 and 110. Therefore, merely corner portions of the body doped region 216 would overlap the adjacent gate strips 210. For example, the body doped region 216 merely has two opposite corners 216C1 and 216C2 overlapping the adjacent gate strips 210. The overlapping area between the body doped region 216 and the adjacent gate strips 210 may be reduced. In some embodiments, a portion of the boundary 216B between the body doped region 216 and the source doped regions 214 of the adjacent unit cells 550 may be V-shape or U-shape (or inversed V-shape or U-shape) in a top view as shown in FIG. 1.

As shown in FIGS. 1 and 2A-2C, in the direction 110, the body doped region 216 may be composed of a center portion 216C and two end portions 216E. The center portion 216C is located between the two end portions 216E along the direction 110. In addition, the body doped region 216 has a length L1 along the direction 100. In some embodiments, the length L1 gradually changes along the direction 110. For example, the length L1 of the body doped region 216 may gradually be reduced from the center portion 216C to the two end portions 216E along the direction 110, as shown in FIGS. 2A-2B. That is to say, the body doped region 216 is tapered from the center portion 216C to the two end portions 216E. In some embodiments, the length L1 has a maximum value at the center portion 216C of the body doped region 216. The maximum value of the length L1 may be equal to the distance between the spacers 211 of the adjacent gate strips 210, as shown in FIGS. 1 and 2A.

As shown in FIGS. 1, 2D and 2E, the body doped region 216 has a width W1 along the direction 110. In some embodiments, the width W1 gradually changes along the direction 100. For example, the width W1 of the body doped region 216 gradually increases along the direction 100 away from the gate strip 210, as shown in FIGS. 2D and 2E. That is to say, the body doped region 216 is tapered toward to the gate strip 210 along the direction 100. In some embodiments, the width W1 has a minimum value at a position closest to the adjacent gate strip 210, as shown in FIGS. 1 and 2D. In addition, the width W1 may have a maximum value at a central position between the gate strips 210 of the adjacent unit cells 550 along the direction 100, as shown in FIGS. 1 and 2E.

As shown in FIG. 1, the source doped region 214 is arranged adjacent to the body doped region 216 and the first sides 210S1 of the gate strips 210 of the adjacent unit cells 550. In some embodiments, the source doped region 214 between the adjacent body doped regions 216 along the direction 110 and between the gate strips 210 of the adjacent unit cells 550 along the direction 100 may be hourglass-shaped in a top view as shown in FIG. 1.

As shown in FIGS. 1, 2B and 2C, in the direction 110, the source doped region 214 may have two end portions 214E and a center portion 214C between the two end portions 214E. The center portion 214C of the source doped region 214 is connected (adjacent) to the end portions 216E of the adjacent body doped regions 216. In other words, the center portion 216C of the body doped region 216 is connected (adjacent) to the end portions 214E of the adjacent source doped regions 214. In addition, the source doped region 214 has a second length L2 along the direction 100. In some embodiments, the second length L2 gradually changes along the direction 110. For example, the second length L2 of the source doped region 214 may gradually be reduced from the center portion 214C to the two end portions 214E along the direction 110, as shown in FIGS. 1, 2B and 2C. For example, the source doped region 214 in the unit cell 550 is tapered from the center portion 214C to the two end portions 214E. In some embodiments, the length L2 has a maximum value at the center portion 214C of the source doped region 214. The maximum value of the length L2 may be equal to the distance between the adjacent spacers 211, as shown in FIGS. 1 and 2C. In addition, the maximum value of the length L2 may be equal to the maximum value of the length L1, as shown in FIGS. 2A and 2C.

As shown in FIGS. 1, 2D and 2E, the source doped region 214 has a width W2 along the direction 110. In some embodiments, the width W2 gradually changes along the direction 100. For example, the width W2 of the source doped region 214 gradually reduces along the direction 100 away from the gate strip 210, as shown in FIGS. 2D and 2E. That is to say, the body doped region 216 is tapered away from the gate strip 210 along the direction 100. In some embodiments, the width W2 may have a maximum value at a position closest to the gate strip 210, as shown in FIG. 2D. When the semiconductor device 500A, for example, a NMOS, is operated (e.g., turns on), the current flows through the channel is increased. In some embodiments, the width W2 has a minimum value at the central position between the adjacent gate strips 210 along the direction 110, as shown in FIG. 2E. In some embodiments, the width W1 of the body doped region 216 at a position closest to the gate strip 210 is less than the width W2 at a position closest to the same gate strip 210, as shown in FIG. 2E.

In some embodiments, ratios of the widths W1 of the body doped region 216 to the widths W2 of the source doped region 214 in the cross-sectional views along the lines in the direction 110 (e.g., the cross-sectional views along the D-D' and E-E' lines in the direction 110 shown in FIGS. 2D and 2E) are gradually increased along the direction 100 away from the gate strip 210. As shown in FIG. 2D, the ratio of the width W1 of the body doped region 216 to the width W2 of the source doped region 214 in the cross-sectional view along the D-D' line in the direction 110 and closest to the gate strip 210 is less than 1. In other words, the width W1 of the body doped region 216 is less than the width W2 of the source doped region 214 in the cross-sectional view along the D-D' line in the direction 110 and closest to the gate strip 210, as shown in FIG. 2D.

As shown in FIGS. 2A-2C, the semiconductor device 500A further includes lightly-doped regions 212 located in the substrate 200 within the active region 300. The lightly-doped regions 212 are formed adjacent to the first side 210S1 and the second side 210S2 of the gate strip 210. In addition, the lightly-doped regions 212 are formed adjacent to the source doped region 214 and the drain doped region 218 and extend below the spacers 211 along the direction 100. In some embodiments, the lightly-doped region 212 may be doped with dopants having a second conductivity type opposite to the first conductivity type. For example, when the well region 202 is p-type, the lightly-doped region 212 is n-type. In addition, the dopant concentration of the lightly-doped region 212 is less than those of the source doped region 214 and the drain doped region 218.

As shown in FIGS. 1 and 2A-2E, the semiconductor device 500A further includes body contacts 226, source contacts 224 and drain contacts 228 disposed on the substrate 200 within the body doped region 216, the source doped region 214 and the drain doped region 218. The body contacts 226 and the source contacts 224 are disposed at the central position between the first sides 210S1 of the gate strips 210 of the adjacent unit cells 550 along the direction 100. In addition, the drain contacts 228 are disposed at the central position between the second sides 210S2 of the gate strips 210 of the adjacent unit cells 550 along the direction 100. As shown in FIG. 1, the body contacts 226 and the source contacts 224 are alternatively arranged along the direction 110 by a pitch P2 according the design rule. In addition, the drain contacts 228 are arranged along the direction 110 by the pitch P2. The source contact 224 is disposed close to one of the end portions 216E of the body doped region 216. In some embodiments, the width W1 of the body doped region 216 has a maximum value at a position where the body contact 226 is located, as shown in FIG. 2E. In addition, the width W1 of the body doped region 216 has the maximum value greater than the pitch P2 and less than two time as much as the pitch P2 (i.e., P2<W1<2P2). If the maximum value of the width W1 of the body doped region 216 is less than the pitch P2, the current flowing through the body contact 226 would be reduced. If the width W1 of the body doped region 216 is greater than two time as much as the pitch P2, the adjacent body doped regions 216 would be connected to each other, so that there would be no enough space for arranging the source doped region 214 and the source contact 224 within the source doped region 214. In some embodiments, the width W2 of the source doped region 214 has a minimum value at a position where the source contact 224 is located, as shown in FIG. 2E. In some embodiments, the ratio of the width W1 of the body doped region 216 to the width W2 of the source doped region 214 in the cross-sectional view along the line crossing the body contact 226 and the source contact 224 in the direction 110 is greater than 1 and less than 2. In other words, the width W1 of the body doped region 216 is greater than the width W2 of the source doped region 214 in the cross-sectional view along the line crossing the body contact 226 and the source contact 224 in the direction 110, as shown in FIG. 2E.

Figure 3:
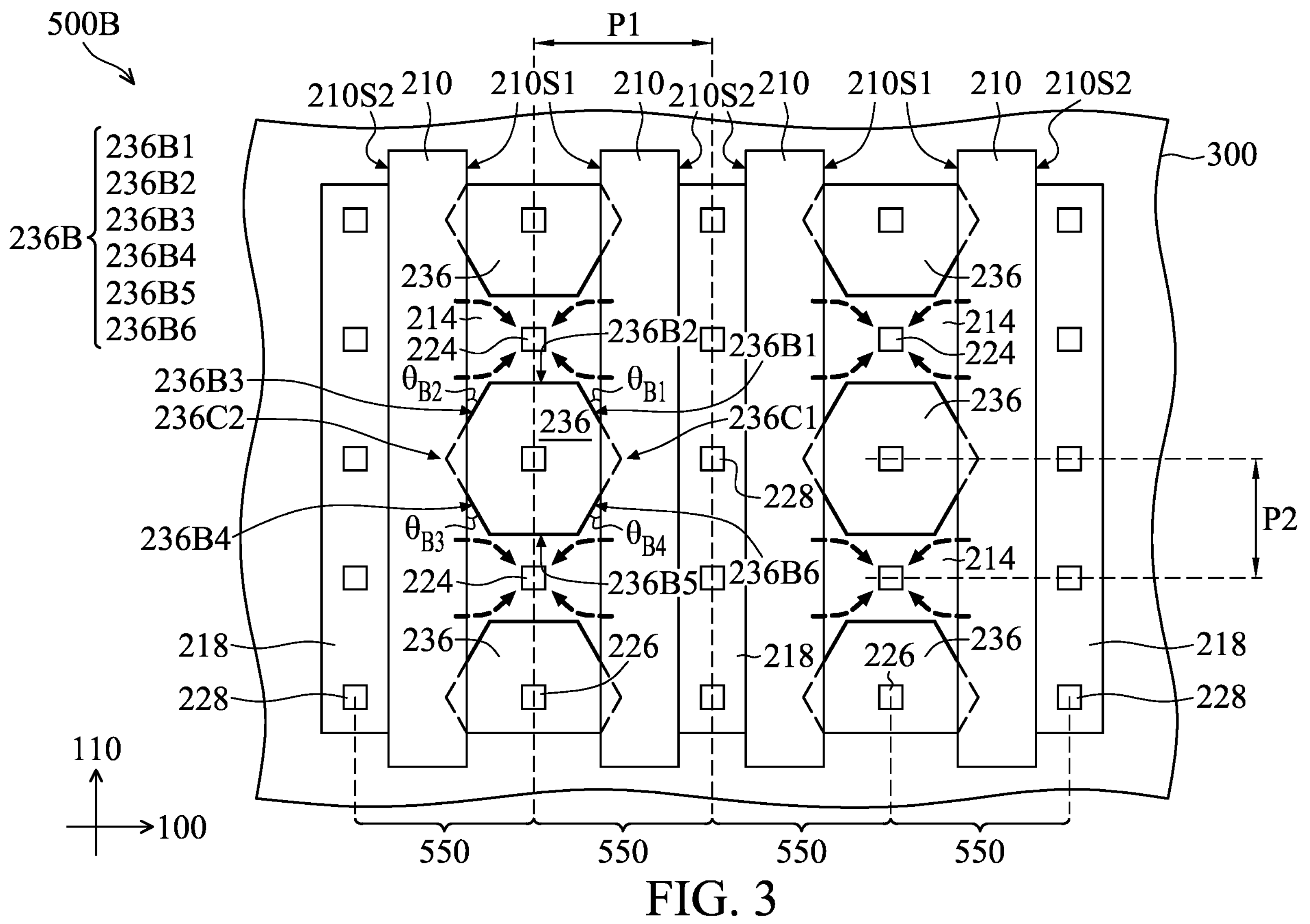
FIGS. 3-5 are schematic layouts of a semiconductor device in accordance with some embodiments of the disclosure.

FIG. 3 is a schematic layout of a semiconductor device 500B in accordance with some embodiments of the disclosure. Elements of the embodiments hereinafter, that are the same or similar as those previously described with reference to FIGS. 1 and 2A-2C are not repeated for brevity. As shown in FIG. 3, the difference between the semiconductor device 500A and the semiconductor device 500B is that the semiconductor device 500B includes a body doped region 236 with a hexagonal shape. In some embodiments, the body doped region 236 includes a boundary 236B including edges 236B1, 236B2, 236B3, 236B4, 236B5 and 236B6. The edges 236B1, 236B3, 236B4 and 236B6 may meet the first sides 210S1 of the gate strips 210 of the adjacent unit cells 550. In some embodiments, an angle $\theta_{B1}$ between the edge 236B1 and the first side 210S1 of the right gate strip 210 is an acute angle. An angle $\theta_{B2}$ between the edge 236B3 and the second side 210S2 of the left gate strip 210 is an acute angle. An angle $\theta_{B3}$ between the edge 236B4 and the second side 210S2 of the left gate strip 210 is an acute angle. An angle $\theta_{B4}$ between the edge 236B6 and the first side 210S1 of the right gate strip 210 is an acute angle. In addition, the body doped region 236 merely has two opposite corners 236C1 and 236C2 overlapping the gate strips 210 of the adjacent unit cells 550.

Figure 4:
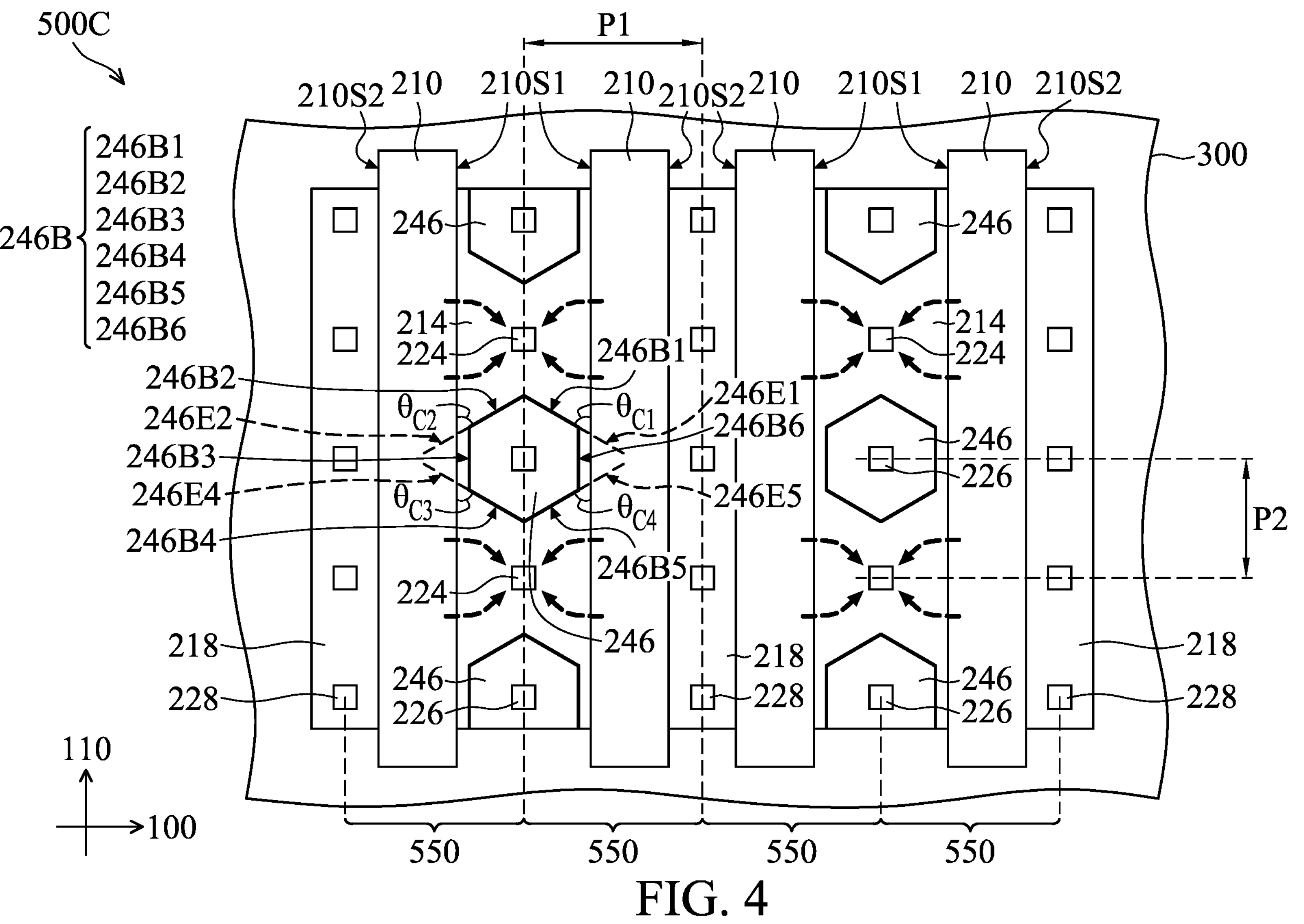

FIG. 4 is a schematic layout of a semiconductor device 500C in accordance with some embodiments of the disclosure. Elements of the embodiments hereinafter, that are the same or similar as those previously described with reference to FIGS. 1, 2A-2C and 3 are not repeated for brevity. As shown in FIG. 4, the difference between the semiconductor device 500A and the semiconductor device 500C is that the semiconductor device 500C includes a body doped region 246 with a hexagonal shape. In some embodiments, the body doped region 246 a boundary 246B including edges 246B1, 246B2, 246B3, 246B4, 246B5 and 246B6. The body doped region 246 does not overlap the adjacent gate strips 210 at all. In addition, extended lines 246E1, 246E2, 246E4 and 246E5 of the edges 246B1, 246B2, 246B4 and 246B5 of the body doped region 246 may meet the first side 210S1 (or the second side 210S2) of the adjacent gate strips 210. In some embodiments, an angle $\theta_{C1}$ between the extended line 246E1 and the first side 210S1 of the right gate strip 210 is an acute angle. An angle $\theta_{C2}$ between the extended line 246E2 and the second side 210S2 of the left gate strip 210 is an acute angle. An angle $\theta_{C3}$ between the extended line 246E4 and the second side 210S2 of the left gate strip 210 is an acute angle. An angle $\theta_{C4}$ between the extended line 246E5 and the first side 210S1 of the right gate strip 210 is an acute angle.

Figure 5:
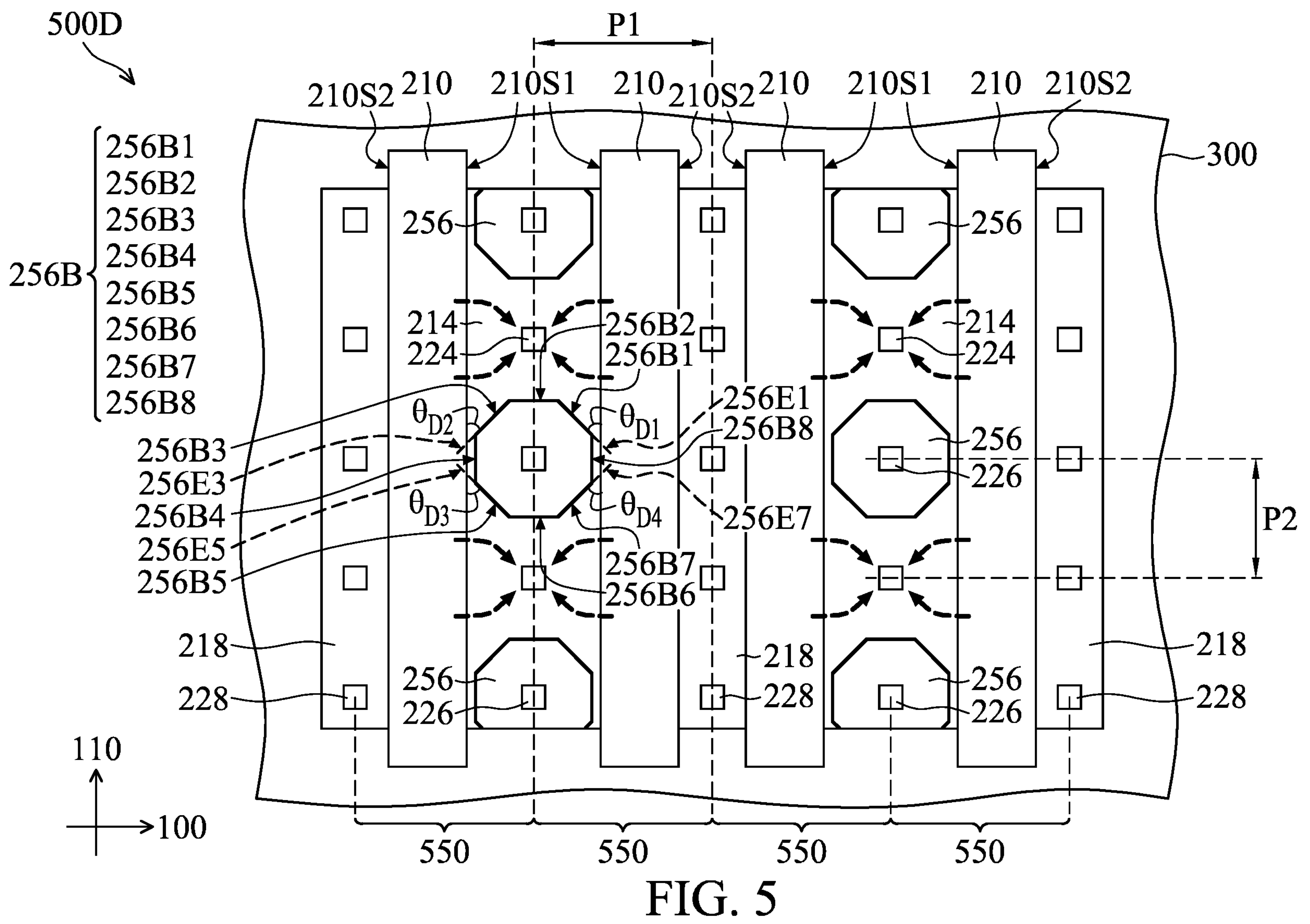

FIG. 5 is a schematic layout of a semiconductor device 500D in accordance with some embodiments of the disclosure. Elements of the embodiments hereinafter, that are the same or similar as those previously described with reference to FIGS. 1, 2A-2C and 3-4 are not repeated for brevity. As shown in FIG. 4, the difference between the semiconductor device 500A and the semiconductor device 500D is that the semiconductor device 500D includes a body doped region 256 with an octagonal shape. In some embodiments, the body doped region 256 including edges 256B1, 256B2, 256B3, 256B4, 256B5, 256B6, 256B7 and 256B8 does not overlap the adjacent gate strips 210. In addition, extended lines 256E1, 246E3, 256E5 and 256E7 of the edges 256B1, 256B32, 256B5 and 256B7 of the body doped region 256 may meet the first side 210S1 (or the second side 210S2) of the adjacent gate strips 210. In some embodiments, an angle $\theta_{D1}$ between the extended line 2546E1 and the first side 210S1 of the right gate strip 210 is an acute angle. An angle $\theta_{D2}$ between the extended line 256E3 and the second side 210S2 of the left gate strip 210 is an acute angle. An angle $\theta_{D3}$ between the extended line 256E5 and the second side 210S2 of the left gate strip 210 is an acute angle. An angle $\theta_{D4}$ between the extended line 256E7 and the first side 210S1 of the right gate strip 210 is an acute angle.

In the conventional power MOS device, the body doped region and the source doped region of opposite conductivities are arranged at the same side of the gate strip extending along the channel width direction. The body doped region and the source doped region are arranged side-by-side along the channel width direction and have a slit-shape extending along the channel length direction. The sides of the body doped region are perpendicular or parallel to the adjacent side of the gate strip extending along the channel width direction. In other words, all sides of the body doped region should extend parallel to the channel length direction (i.e. the direction 100) or the channel width direction (i.e., the direction 110). Therefore, the sides of the conventional body doped region and the adjacent side of the gate strip would meet at an angle of 90 degrees or a multiple of 90 degrees. In addition, the slit-shaped body doped region has at least an edge portion (including two corner portions) partially overlapping the adjacent gate strip according to the design rule. The dopant of the body doped region of the conductivity opposite that of the source doped region may diffuse into the gate strip, thereby causing increased on-resistance (Ron) and partially turn-on problems. Compared with the conventional power MOS device with the slit-shaped body doped region, the body doped region of the semiconductor device in the same area is designed to have at least one oblique edge meeting the first side (or the second side) of the adjacent gate strip. Alternatively, the body doped region of the semiconductor device may not overlap the adjacent gate strip and an extended line of the oblique edge of the body doped region may meet the first side (or the second side) of the adjacent gate strip. Therefore, an angle between the oblique edge of the body doped region (or the extended line of the oblique edge of the body doped region) and the first side (or the second side) of the adjacent gate strip is an acute angle (greater than 90 degrees and less than 180 degrees). In other words, the oblique edge of the body doped region (or the extended line of the oblique edge of the body doped region) that meets the first side (or the second side) of the adjacent gate strip may extend in a direction that is not parallel to the channel length direction (i.e. the direction 100) or the channel width direction (i.e., the direction 110). The portion of the body doped region overlapping the adjacent gate strip may have a reduced area. The source doped region may have a maximum width (e.g., the width W2 shown in FIG. 2D) in the channel width direction (i.e., the direction 110) at the position closest to the adjacent gate strip. When the semiconductor device, for example, a NMOS, is operated (e.g., turns on), the current flows through the channel (illustrated as dotted arrows shown in FIGS. 1 and 3-5) is increased. Therefore, the semiconductor device may have a reduced on-resistance (Ron) and an increased on-state current (Ion).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:

a substrate having an active region;

a gate strip disposed on the substrate within the active region, wherein the gate strip extends along a first direction;

a source doped region located in the active region and adjacent to a first side of the gate strip along the first direction; and a body doped region located in the active region and adjacent to the first side of the gate strip, wherein the body doped region and the source doped region have opposite conductivity types, wherein the body doped region has a first length along a second direction that is different from the first direction, wherein the first length gradually changes along the first direction, and wherein the semiconductor device includes a power metal-oxide-semiconductor field effect transistor (MOSFET) device, the first direction is a channel length direction, and the second direction is a channel width direction.

2. The semiconductor device as claimed in claim 1, wherein the body doped region has a center portion located between two end portions along the first direction, wherein the body doped region is tapered from the center portion to the two end portions.

3. The semiconductor device as claimed in claim 2, wherein the first length has a maximum value at the center portion of the body doped region.

4. The semiconductor device as claimed in claim 1, wherein the body doped region is disposed adjacent to the source doped region along the first direction.

5. The semiconductor device as claimed in claim 1, wherein the body doped region is tapered toward to the gate strip along the second direction.

6. The semiconductor device as claimed in claim 1, wherein the body doped region has a first width along the first direction, wherein the first width gradually changes along the second direction.

7. The semiconductor device as claimed in claim 6, wherein the first width has a minimum value at a position closest to the gate strip.

8. The semiconductor device as claimed in claim 6, further comprising:

a first contact disposed on the substrate within the body doped region.

9. The semiconductor device as claimed in claim 8, wherein the first width has a maximum value at a position where the first contact is located.

10. The semiconductor device as claimed in claim 2, wherein the source doped region has a second length along the second direction, wherein the second length gradually changes along the first direction.

11. The semiconductor device as claimed in claim 10, wherein the source doped region has a center portion between two end portions along the first direction, wherein the source doped region is tapered from the center portion to the two end portions.

12. The semiconductor device as claimed in claim 11, wherein the second length has a maximum value at the center portion of the source doped region.

13. The semiconductor device as claimed in claim 11, wherein the center portion of the source doped region is connected to one of the end portions of the body doped region.

14. The semiconductor device as claimed in claim 11, wherein the center portion of the body doped region is connected to one of the end portions of the source doped region.

15. The semiconductor device as claimed in claim 1, wherein the source doped region is tapered away from the gate strip along the second direction.

16. The semiconductor device as claimed in claim 1, wherein the source doped region has a second width along the first direction, wherein the second width gradually changes along the second direction.

17. The semiconductor device as claimed in claim 16, wherein the second width has a maximum value at a position closest to the gate strip.

18. The semiconductor device as claimed in claim 16, further comprising:

a second contact disposed on the substrate within the source doped region, wherein the second contact is disposed close to one of the end portions of the body doped region.

19. The semiconductor device as claimed in claim 18, wherein the second width has a minimum value at a position where the second contact is located.

20. The semiconductor device as claimed in claim 1, further comprising:

a drain doped region located in the active region and adjacent to a second side of the gate strip along the first direction, wherein the first side is opposite to the second side.

21. A semiconductor device, comprising:

a substrate of a first conductivity type having an active region;

a first gate strip disposed on the substrate within the active region, wherein the first gate strip extends along a first direction;

a source doped region of a second conductivity type located in the active region and adjacent to a first side of the gate strip; and a body doped region of the first conductivity type located in the active region and adjacent to the first side of the first gate strip, wherein the body doped region has least one edge close to the first side of the first gate strip, wherein an extended line of the edge of the body doped region meets the first side of the first gate strip, and wherein an angle between the extended line and the first side of the first gate strip is an acute angle.

22. The semiconductor device as claimed in claim 21, wherein the first boundary is V-shape or U-shape in a top view.

23. The semiconductor device as claimed in claim 21, wherein the source doped region is hourglass-shaped in a top view.

24. The semiconductor device as claimed in claim 21, wherein the body doped region is polygonal-shaped in a top view.

25. The semiconductor device as claimed in claim 21, wherein the body doped region has a first width along the first direction, wherein the first width is gradually increased along a direction away from the first gate strip.

26. The semiconductor device as claimed in claim 25, wherein the source doped region has a second width along the first direction, wherein the second width is gradually decreased along the direction away from the gate strip.

27. The semiconductor device as claimed in claim 26, wherein the first width is less than the second width in the cross-sectional view along the line in the first direction and closest to the gate strip.

28. The semiconductor device as claimed in claim 26, further comprising:

a first contact disposed on the substrate within the body doped region; and a second contact disposed on the substrate within the source doped region, wherein the first width is greater than the second width in the cross-sectional view along the line in the first direction and crossing the first contact and the second contact.

29. The semiconductor device as claimed in claim 21, further comprising:

a drain doped region disposed in the substrate within the active region and adjacent to a second side of the gate strip along the first direction, wherein the first side is opposite to the second side.

30. A semiconductor device, comprising:

a substrate of a first conductivity type having an active region;

a gate strip disposed on the substrate within the active region, wherein the gate strip extends along a first direction;

a source doped region of a second conductivity type disposed in the active region and adjacent to a first side of the gate strip; and a body doped region of the first conductivity type disposed in the active region and adjacent to the first side of the gate strip, wherein ratios of widths of the body doped region to widths of the source doped region in cross-sectional views in the first direction are gradually increased along a direction away from the first gate strip.

31. The semiconductor device as claimed in claim 30, wherein the ratio of the width of the body doped region to the width of the source doped region in the cross-sectional view along the line closest to the gate strip is less than 1.

32. The semiconductor device as claimed in claim 30, further comprising:

a first contact disposed on the substrate within the body doped region; and a second contact disposed on the substrate within the source doped region, wherein the ratio of the width of the body doped region to the width of the source doped region in the cross-sectional view along the line crossing the first contact and the second contact is greater than 1 and less than 2.

* * * * *